(12) United States Patent
Armstrong et al.

(10) Patent No.: US 7,957,066 B2
(45) Date of Patent: Jun. 7, 2011

(54) SPLIT FIELD INSPECTION SYSTEM USING SMALL CATADIOPTRIC OBJECTIVES

(75) Inventors: J. Joseph Armstrong, Milpitas, CA (US); Yung-Ho Chuang, Cupertino, CA (US)

(73) Assignee: KLA-Tencor Corporation, San Jose, CA (US)

(*) Notice: Subject to any disclaimer, the term of this patent is extended or adjusted under 35 U.S.C. 154(b) by 106 days.

(21) Appl. No.: 12/220,983

(22) Filed: Jul. 29, 2008

(65) Prior Publication Data

US 2009/0180176 A1 Jul. 16, 2009

Related U.S. Application Data

(63) Continuation-in-part of application No. 11/543,519, filed on Oct. 4, 2006, now Pat. No. 7,679,842, which is a continuation of application No. 10/434,374, filed on May 7, 2003, now Pat. No. 7,180,658.

(60) Provisional application No. 61/069,997, filed on Mar. 18, 2008, provisional application No. 60/449,326, filed on Feb. 21, 2003.

(51) Int. Cl.
*G02B 27/10* (2006.01)
*G01B 11/30* (2006.01)
*G01N 21/00* (2006.01)

(52) U.S. Cl. ........ 359/618; 359/629; 359/634; 356/611; 356/237.2

(58) Field of Classification Search .................. 359/618; 250/575, 578.1; 356/237.4, 237.5
See application file for complete search history.

(56) References Cited

U.S. PATENT DOCUMENTS

| | | | |
|---|---|---|---|
| 6,208,411 B1* | 3/2001 | Vaez-Iravani | 356/237.2 |
| 6,560,039 B1 | 5/2003 | Webb et al. | |
| 7,136,234 B2 | 11/2006 | Shafer et al. | |
| 0,279,837 A1 | 12/2006 | Chuang et al. | |
| 7,227,637 B2* | 6/2007 | Wang et al. | 356/326 |
| 7,251,036 B2* | 7/2007 | Hendrix et al. | 356/445 |
| 7,307,783 B2 | 12/2007 | Armstrong et al. | |
| 2009/0309049 A1* | 12/2009 | Van Dijk et al. | 250/578.1 |

* cited by examiner

*Primary Examiner* — Jordan M. Schwartz
(74) *Attorney, Agent, or Firm* — Smyrski Law Group, A.P.C.

(57) ABSTRACT

A system for inspecting a specimen is provided. The system includes an illumination subsystem configured to produce a plurality of channels of light energy, each channel of light energy produced having differing characteristics (type, wavelength, etc.) from at least one other channel of light energy. Optics are configured to receive the plurality of channels of light energy and combine them into a spatially separated combined light energy beam and direct it toward the specimen. A data acquisition subsystem comprising at least one detector is provided, configured to separate reflected light energy into a plurality of received channels corresponding to the plurality of channels of light energy and detect the received channels.

21 Claims, 4 Drawing Sheets

FIG. 2

| IMAGING MODE | ILLUMINATION PUPIL | OBJECTIVE FIELD | IMAGING PUPIL |
|---|---|---|---|
| BRIGHT FIELD | ○ | ◐ | ○ |
| EDGE CONTRAST (EC) | ⊙ | ◐ | ⊖ |
| PHASE CONTRAST | ⊚ OR ⊙ | ◐ | ⊛ OR ⊚ |
| PUPIL SHAPING (ONE EXAMPLE) | ⊖ | ◐ | ✣ |
| 2-D ARRAY CONFOCAL | ○ OR ⊙ | ▦ | ○ |
| DIRECTIONAL DARK FIELD | ◗ | ⊖◐⊖ | ⊖ |
| DIRECTIONAL DARK FIELD (CARRERA) | ● | ◐ | ◉ |
| NORMAL DARK FIELD | ◐ | ⊖◐⊖ | ✣ |
| LINE CONFOCAL | ◍ | ◐ | ○ BF / ⊘ DF |

SPLIT FIELD INSPECTION SYSTEM USING SMALL CATADIOPTRIC OBJECTIVES

This application claims the benefit of U.S. Provisional Patent Application Ser. No. 61/069,997, entitled "Split Field Inspection System Using Small Catadioptric Objectives," filed Mar. 18, 2008, which is a continuation-in-part of currently pending U.S. patent application Ser. No. 11/543,519, filed Oct. 4, 2006, entitled "High Performance Catadioptric Imaging System," inventors Shafer et. al., which is a continuation of U.S. patent application Ser. No. 10/434,374, now U.S. Pat. No. 7,180,658, filed May 7, 2003, entitled "High Performance Catadioptric Imaging System," inventors Shafer et. al., which claims the benefit of U.S. Provisional Patent Application Ser. No. 60/449,326, entitled "High Performance, Low Cost Catadioptric Imaging System," filed Feb. 21, 2003.

BACKGROUND OF THE INVENTION

1. Field of the Invention

The present invention relates generally to the field of optical imaging and more particularly to optical systems for microscopic imaging, inspection and/or lithography applications.

2. Description of the Related Art

Many optical systems and electronic systems are available to inspect surface features of a specimen for defects, including specimens such as a partially fabricated integrated circuit. Defects on such specimens may be relatively small in size and may take the form of imperfections randomly localized on the specimen surface, such as particles, scratches, process variations, repeating pattern defects, and so forth. Techniques and devices for inspecting specimens for these microscopic defects are generally available in the art and are embodied in various commercially available products, including those available from KLA-Tencor Corporation of San Jose, Calif.

The aim of virtually any type of inspection system or technique is to rapidly and efficiently detect defects. With smaller and smaller features on specimen surfaces and the use of new materials and new manufacturing processes, detection of new and finer defects is required. It is also preferable to inspect a specimen surface in as short an amount of time as possible, from loading the specimen to removing it from the inspection position and characterizing the defects. Such speed requirements in the presence of smaller features mandate continuous improvements in the available systems and techniques to accurately and adequately find specimen problems.

Current inspection systems are generally based either on refractive objectives or relatively large sized catadioptric objectives. Systems based on refractive objectives are limited due to imaging performance being typically capped in the presence of light energy transmitted at wavelengths above 365 nm. Designs accommodating shorter wavelengths are possible, but only over a very narrow bandwidth. Design of UV objectives having good correction over fields larger than 100 microns with NAs (numerical apertures) larger than 0.9 has also been difficult.

Inspection systems based on large catadioptric objectives can assist with wavelength limitations seen in refractive objectives. Narrow band catadioptric objective designs with NAs of 0.97 or larger and large field size are possible. These large catadioptric objectives have limitations including high cost, tight manufacturing tolerances, inflexible system architectures, and difficulty controlling contamination associated with DUV illumination.

Many of the aforementioned imaging systems have been constructed of relatively large components, which are difficult or impossible to employ in small environments, such as microscopes and the like. In addition, because of their large size, using multiple objectives in the same system is not practical. However, smaller inspection objectives than have been typically available have been developed. One such ultra-high NA objective is disclosed in U.S. patent application Ser. No. 11/093,850, entitled "Small Ultra-High NA Catadioptric Objective," inventors Yung-Ho Chuang et al., filed Mar. 29, 2005, U.S. Patent Publication 2006/0158720.

The system disclosed in the '850 application offers certain imaging components and arrangements for inspecting specimens, but the designs disclosed therein cannot simply be used in all environments for imaging different types of specimens. Inspection systems using different geometries, different light sources, with different performance criteria cannot use the designs of the '850 application to accurately and adequately assess specimen flaws under all circumstances.

It would therefore be desirable to have a system for inspecting a specimen that improves upon the systems previously available, and in particular for enabling inspection of specimens such as wafers using a small sized catadioptric objective. It would be particularly desirable to offer systems or designs that may be used under various circumstances and with various components that overcome the imaging issues associated with previously known designs.

SUMMARY OF THE INVENTION

According to one aspect of the present invention, there is provided a system for inspecting a specimen comprising an illumination subsystem configured to produce a plurality of channels of light energy, each channel of light energy produced having differing characteristics (type, wavelength, etc.) from at least one other channel of light energy, optics configured to receive the plurality of channels of light energy and combine the plurality of channels of light energy into a spatially separated combined light energy beam and direct the spatially separated combined light energy beam toward the specimen, and a data acquisition subsystem comprising at least one detector configured to detect reflected light energy received from said specimen. The data acquisition subsystem is configured to separate reflected light energy into a plurality of received channels corresponding to the plurality of channels of light energy.

These and other aspects of the present invention will become apparent to those skilled in the art from the following detailed description of the invention and the accompanying drawings.

DESCRIPTION OF THE DRAWINGS

The present invention is illustrated by way of example, and not by way of limitation, in the figures of the accompanying drawings in which:

FIG. 2 illustrates examples of possible apertures;

DETAILED DESCRIPTION OF THE INVENTION

Figure 1:
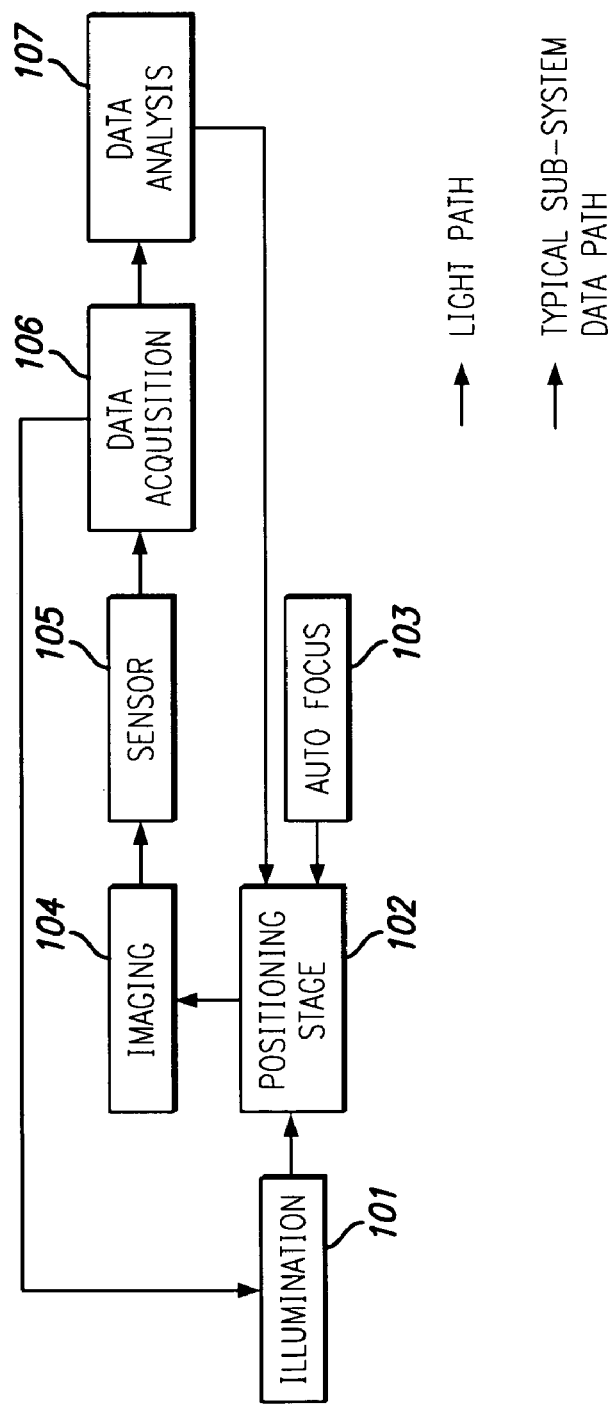
FIG. 1 is a typical inspection system.

The inspection systems currently available are highly complex, requiring a sophisticated combination of light source, illumination, imaging, positioning, automatic focusing, image sensor, data acquisition, and data analysis subsystems. New optical designs can enable new inspection system architectures with improved performance, features, and flexibility.

The development of small sized catadioptric objectives that support ultra-high NA narrow band imaging has enabled improvements to existing inspection system architectures. Use of small objectives enables shorter wavelength inspection than possible using standard refractive based systems. The ultra-high NA designs enable a range of different inspection modes to be implemented as well as allowing different inspection modes to be used simultaneously. In addition, the ultra-high NA provides reduced interference effects from multiple layers on samples and increases the available light for faster inspection speeds.

An inspection system based on an ultra-high NA small catadioptric objective has enhanced flexibility over systems using a large catadioptric objective. The small size allows for multiple objectives to be used on the same platform. Small sized ultra-high NA catadioptric objectives, small sized broad band catadioptric objectives, and refractive objectives can be used interchangeably. Each objective can be optimized for a desired magnification, field size, wavelength range, and inspection mode. This allows different systems to be configured for optimum defect detection depending on the defect types expected. This also allows the system to be easily reconfigured if the defect types of interest change.

Inspection systems using ultra-high NA small catadioptric objectives also have reduced cost compared to systems based on previous large ultra-high NA catadioptric objective. Previous objectives had tight manufacturing tolerances, i.e. needed to be manufactured to very rigid standards. Small ultra-high NA catadioptric objectives generally have loose manufacturing tolerances allowing them to be manufactured for much less than large catadioptric objectives, as loose tolerances do not require the time, effort, and expense associated with tighter tolerances. Also, contamination associated with DUV (deep ultraviolet) illumination is easier to address because it is easier to isolate sensitive areas when using DUV light energy and purge or somehow address these areas to prevent long term contamination. In addition, if any single part does become contaminated, the part can be readily replaced when a small ultra-high NA catadioptric objective is employed.

The present design is a system and method for inspecting a specimen, such as a semiconductor wafer, that illuminates at least a portion of the specimen using a source employing at least one relatively intense wavelength transmitted from the source, detecting radiation received from the illuminated portion of the specimen, and analyzing the detected radiation to view potential defects present in the portion of the specimen. The present design allows for separate portions of the objective field to be used for separate inspection modes, and these modes can be used simultaneously.

The inspection system and designs disclosed herein employ an imaging subsystem having advantages over previous catadioptric designs. FIG. 1 illustrates a typical inspection system having an illumination subsystem 101, positioning stage 102, autofocus subsystem 103, imaging subsystem 104, sensor subsystem 105, data acquisition subsystem 106, and data analysis subsystem 107. Light travels via the light path shown from the illumination subsystem 101 to the positioning stage 102, the imaging subsystem 104, and the sensor subsystem or sensor 105. Data passes between the autofocus subsystem 103 and the positioning stage 102 and between the sensor 105 and the data acquisition subsystem 106. Data also passes between the data acquisition subsystem 106 and the illumination subsystem 101, and between the data acquisition subsystem 106 and the data analysis subsystem 107, as well as between the data analysis subsystem 107 and the positioning stage 102.

The purpose of the components depicted in FIG. 1 is the emission of illumination from illumination subsystem 101 toward the specimen (not shown), typically maintained and possibly moved using positioning stage 102, whereby light energy passes to imaging optics or other imaging components in imaging subsystem 104 and eventually to sensor subsystem 105. Data is acquired from the sensor or sensor subsystem 105 using data acquisition subsystem 106, which may interact with the sensor subsystem to more accurately sense data received. Accuracy of sensing may be increased via positioning, focus, or in some other manner. Data acquired may be analyzed using data analysis subsystem 107, which may include, for example, databases having appearance of known specimens and/or specimen defects. Data analysis information may be fed back to the data acquisition subsystem 106, to for example reacquire data, and may be provided to positioning stage 102 to reposition the specimen. Data acquisition subsystem 106 may also interact with the illumination subsystem 101 to alter illumination characteristics depending on the quality of image received. Finally, autofocus subsystem 103 may be employed with positioning stage 102 to automatically focus the specimen.

Inspection Modes

Many different modes exist to inspect specimens such as partially fabricated integrated circuits. Various inspection modes may be employed in accordance with the present system, depending on the application and environment. Inspection modes that may be used with the present design include bright field, ring dark field, full sky, directional dark field, differential interference contrast (DIC), confocal, and aperture shaping inspection. These modes can be implemented using reflection of light energy for the purpose of inspecting specimens. The inspection designs employed herein can support one or more of these inspection modes, as well as potentially other inspection modes.

Bright field inspection mode is similar to inspection in common microscope systems where a magnified view of the object or specimen is projected onto a sensor. In bright field imaging, the image produced is readily distinguishable. Image feature size accurately represents the size of object features multiplied by the magnification of the optical system. Thus bright field inspection can be readily employed with image comparison and processing algorithms for computerized object detection and classification of patterned objects. The bright field inspection mode is frequently used for semiconductor wafer inspection.

Dark field inspection modes are primarily used to detect scattering from edges, enhancing the small particles, and irregular surfaces. For example, smooth flat areas scatter very little light resulting in a dark image. Any surface features, particles, or objects protruding above the flat area scatter light and produce a bright area or region. Dark field inspection modes provide a large signal for small features that have a tendency to scatter the light energy received. This large signal allows larger sensor pixels to be used for a given feature size, permitting faster wafer inspections. Dark field inspection may be used with Fourier filtering, which can be used in specimens having repeating patterns to minimize the repeating pattern signal and enhance the defect signal to noise ratio.

Many different dark field inspection modes exist, including but not limited to ring dark field and directional dark field. Each dark field mode uses a specific illumination and collection scheme such that the scattered and diffracted light collected from the object provides a highly accurate signal. The ring dark field inspection mode consists of illumination and imaging pupils that do not overlap. A typical example of this is an illumination NA that delivers light to the wafer through the high NA portion of the optical pupil. An aperture in the imaging pupil can be used to block the outside portion of the NA used for illumination and allow scattered light collected in the inner portion of the imaging pupil to pass and form an image. Features on the wafer may be illuminated uniformly from dark field light energy transmitted from multiple directions so that features with different orientations are equally well imaged. The numerical apertures (NAs) can also be reversed with the illumination passing through the central portion of the NA, with the scattered light collected from the outer portion of the NA.

Directional dark field inspection mode can be employed in various configurations, typically depending on the particular type of defect encountered or expected to be encountered. One configuration, sometimes referred to as aperture shaping, uses apertures placed at the illumination and imaging pupils. Apertures are used to select different portions of the illumination and imaging pupils. For example, an aperture can be placed near the edge of the illumination pupil, thereby effectively delivering a small cone of light at a high incident angle to the wafer. Another aperture or apertures can then be placed in the imaging pupil to select a desired portion of the scattered light. For example, two apertures can be placed 90 degrees from the illumination pupil aperture, thereby selecting the light scattered sideways by features on the wafer.

Other illumination and imaging pupil apertures can be used to optimize for specific defect types. Another configuration, sometimes referred to as laser directional dark field, uses one or more lasers that illuminate the sample at high angles of incidence from outside the objective. Often four illumination beams are chosen, each 90 degrees offset from other illumination beams. This geometry tends to minimize any directional dependence of features on the sample. A further configuration, sometimes called internal laser dark field, is a hybrid of the aperture shaping and the laser directional dark field modes. In laser dark field, the system injects a laser beam into a specific location in the illumination pupil of an optical system.

Full sky optical configuration combines aspects of bright field and ring dark field inspection. Full sky uses differing amounts of attenuation so the relative bright field signal and dark field signal can be adjusted, thus allowing detection of both bright field and dark field defects simultaneously using the same sensor.

Differential Interference Contrast (DIC) inspection provides the ability to resolve gradients in the topology of object features. In DIC, image contrast increases for increasing gradients in the optical path. DIC mode uses a spatial shearing system with the shear distance on the order of the optical system resolution, and is typically implemented by separating the illumination into two orthogonal polarized beams. These beams interact with the features on the object and are recombined before the image is formed.

Confocal inspection can resolve the topology differences of object features. Most optical configurations have difficulty detecting changes in the topology of features. The confocal configuration discriminates between different heights by using apertures near the illumination and imaging focus. Laser illumination can also be used to eliminate the need for the illumination aperture.

Aperture shaping is a general form of inspection that allows custom illumination pupils and corresponding imaging pupils to be used to optimize the defect signal-to-noise ratio. To obtain a custom illumination pupil, an aperture can be placed at the illumination plane to shape the illumination. The drawback of using apertures is that light energy may be blocked and therefore not used to illuminate the sample. Alternately, a diffractive optic can be used to generate a custom illumination pattern while preserving the light energy. A corresponding aperture can be placed in the imaging pupil to control the light energy reaching the detector. For example, if an aperture blocks the zero order light reflected from the sample, then a form of dark field imaging is produced. Examples of possible apertures are shown in FIG. 2.

Figure 3:
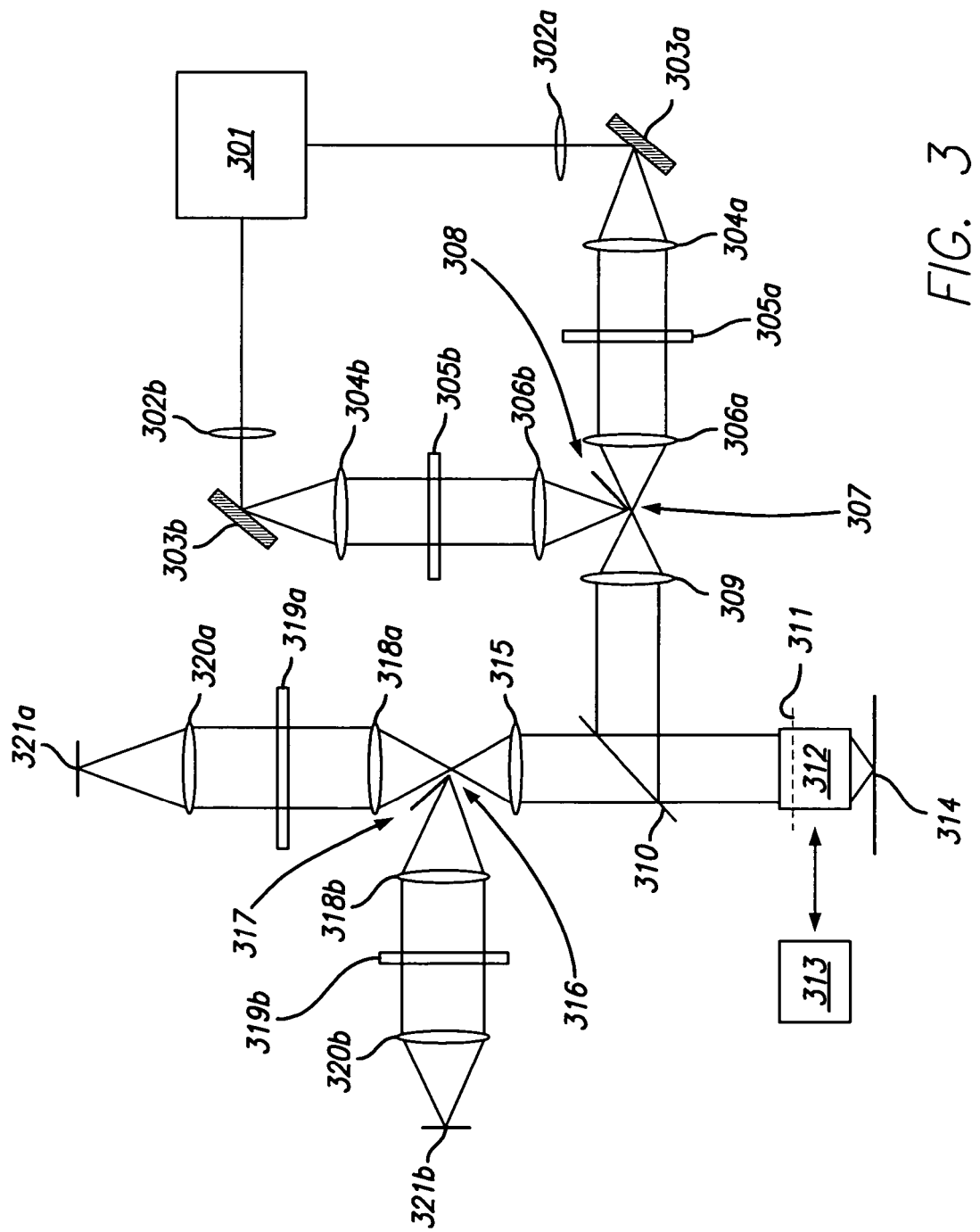
FIG. 3 represents an illumination subsystem comprised of a laser illumination source with preferably more than one wavelength, an imaging subsystem comprised of at least one ultra-high NA small catadioptric objective, and a sensor subsystem configured to support multiple simultaneous inspection modes.

One aspect of the present inspection system includes an illumination subsystem comprised of a laser illumination source configured to transmit light energy at more than one wavelength, an imaging subsystem comprised of at least one ultra-high NA small catadioptric objective, and a sensor subsystem comprised of at least one sensor to support multiple simultaneous inspection modes. This embodiment is shown in FIG. 3. The drawing in FIG. 3 shows a schematic layout with single lens elements, and depending on desired performance, additional lens elements in the illumination and imaging subsystems may be provided.

From FIG. 3, illumination from laser source 301 is sent to one or more sections of the illumination subsystem. A first section of the illumination subsystem includes elements 302a through 306a. Lens 302a focuses light from laser 301. Light from lens 302a then reflects from mirror 303a. Mirror 303a is placed at this location for the purposes of illustration, and may be positioned elsewhere. Light from mirror 303a is then collected by lens 304a which forms illumination pupil plane 305a. An aperture, filter, or other device to modify the light may be placed in pupil plane 305a depending on the requirements of the inspection mode. Light from pupil plane 305a then passes through lens 306a and forms illumination field plane 307.

A second section of the illumination subsystem includes elements 302b through 306b. Lens 302b focuses light from laser 301. Light from lens 302b then reflects from mirror 303b. Light from mirror 303b is then collected by lens 304b which forms illumination pupil plane 305b. An aperture, filter, or other device to modify the light may be placed in pupil plane 305b depending on the requirements of the inspection mode. Light from pupil plane 305b then passes through lens 306b and forms illumination field plane 307. The second section is then redirected by mirror or reflective surface 308. Illumination field light energy at illumination field plane 307 is thus comprised of the combined illumination sections.

Field plane light is then collected by lens 309 before reflecting of beamsplitter 310. Lenses 306a and 309 form an image of first illumination pupil plane 305a at objective pupil plane 311. Likewise, lenses 306b and 309 form an image of second illumination pupil plane 305b at objective pupil plane 311. Objective 312 or 313 then take pupil light 311 and form an image of illumination field 307 at the sample 314. Objectives 312 and 313 can be positioned in proximity to sample 314. Sample 314 can move on a stage (not shown), which positions the sample in the desired location. Light reflected and scattered from the sample 314 is collected by the high NA catadioptric objective 312 or 313. After forming a reflected light pupil at point 311, light energy passes beamsplitter 310 and lens 315 before forming an internal field 316 in the imaging subsystem. This internal imaging field is an image of sample 314 and correspondingly illumination field 307. This field may be spatially separated into multiple fields corresponding to the illumination fields. Each of these fields can support a separate imaging mode.

One of these fields can be redirected using mirror 317. The redirected light then passes through lens 318b before forming another imaging pupil 319b. This imaging pupil is an image of the pupil 311 and correspondingly illumination pupil 305b. An aperture, filter, or other device to modify the light may be placed in pupil plane 319b depending on the requirements of the inspection mode. Light from pupil plane 319b then passes through lens 320b and forms an image on sensor 321b. In a similar manner, light passing by mirror or reflective surface 317 is collected by lens 318a and forms imaging pupil 319a. Light from imaging pupil 319a is then collected by lens 320a before forming an image on detector 321a. Light imaged on detector 321a can be used for a different imaging mode from the light imaged on sensor 321b.

Illumination

The illumination subsystem employed in the current design is composed of a laser source 301, collection optics 302-304, beam shaping components placed in proximity to a pupil plane 305, and relay optics 306 and 309. An internal field plane 305 is located between lenses 306 and 309. The laser source 301 can produce a single wavelength or multiple independent wavelengths.

Laser sources used in the present design achieve the required output power, have relatively high stability, and relatively long lifetime. An example laser source that meets the requirements for power, stability, and DUV wavelengths is described in patent application Ser. No. 11/056,855, entitled "Fiber Amplifier Based Light. Source for Semiconductor Inspection," inventors Yung-Ho Chuang et al., filed Feb. 11, 2005, the entirety of which is incorporated herein by reference. It can be advantageous to use a frequency converted laser source because multiple harmonics of the fundamental wavelength can be produced. As an example, it is possible to frequency double, triple and quadruple a laser with a fundamental wavelength of 1064 nm to produce a laser with one or more of the wavelengths 532, 355, and 266 nm as output. Other laser sources can be used, including but not limited to solid state, ion, direct semiconductor, and excimer laser sources.

Thus with respect to laser source 301, while illustrated as a single uniform block having two points or angles of transmission in FIG. 3, in reality this represents a laser source able to provide two channels of illumination, for example a first channel of light energy such as laser light energy at a first frequency which passes through elements 302a-306a, and a second channel of light energy such as laser light energy at a second frequency which passes through elements 302b-306b. Different light energy modes may be employed, such as bright field energy in one channel and a dark field mode in the other channel. Thus while laser source 301 is illustrated as a single unit, in actuality laser source 301 represents any light generating source or combination, including an arrangement of multiple discrete elements that produce the light energy necessary to produce the "split field" illumination.

While light energy from laser source 301 is shown to be emitted 90 degrees apart, and the elements 302a-306a and 302b-306b are oriented at 90 degree angles, in reality light may be emitted at various orientations, not necessarily in two dimensions, and the components may be oriented differently than as shown. FIG. 3 is therefore simply a representation of the components employed and the angles or distances shown are not to scale nor specifically required for the design.

Elements placed in proximity to pupil plane 305 may be employed in the current system using the concept of aperture shaping. Using this design, uniform illumination or near uniform illumination may be realized, as well as individual point illumination, ring illumination, quadrapole illumination, or other desirable patterns.

Imaging

The design of the imaging subsystem in the present design is based on an ultra-high NA small size catadioptric objective having a large field and accommodating a narrow band light source to support a variety of inspection modes. This large field may be divided into spatially separate regions, where each region supports a separate inspection mode. According to the present design, the objective is corrected over field sizes of greater than 0.4 mm using a single glass material, or in certain circumstances, more than one glass material to improve performance.

Various implementations for the objectives may be employed in a general imaging subsystem. A single fixed objective may be used. The single objective may support all the desired imaging and inspection modes. Such a design is achievable if the imaging system supports a relatively large field size and relatively high numerical aperture. Numerical aperture can be reduced to a desired value by using internal apertures placed at the pupil planes 305a, 305b, 319a, and 319b.

Multiple objectives may also be used as shown in FIG. 3. Two objectives 312 and 313 are shown in this figure, but any number is possible. Each objective in such a design may be optimized for each wavelength produced by laser source 301. These objectives 312 and 313 can either have fixed positions or be moved into position in proximity to the sample 314. To move multiple objectives in proximity to the sample, rotary turrets may be used as are common on standard microscopes. Other designs for moving objectives in proximity of a sample are available, including but not limited to translating the objectives laterally on a stage, and translating the objectives on an arc using a goniometer. In addition, any combination of fixed objectives and multiple objectives on a turret can be achieved in accordance with the present system.

The maximum numerical apertures of the current embodiments approach or exceed 0.97, but may in certain instances be higher. The wide range of illumination and collection angles possible with this high NA catadioptric imaging system, combined with its large field size allows the system to simultaneously support multiple inspection modes. As may be appreciated from the previous paragraphs, multiple imaging modes can be implemented using a single optical system or machine in connection with the illumination device. The high NA disclosed for illumination and collection permits the implementation of imaging modes using the same optical system, thereby allowing optimization of imaging for different types of defects or samples.

The imaging subsystem also includes intermediate image forming optics 315. The purpose of the image forming optics 315 is to form an internal image 316 of the sample 314. At this internal image 316 a mirror 317 can be placed to redirect light corresponding to one of the inspection modes. It is possible to redirect the light at this location because the light for the imaging modes are spatially separate.

The image forming optics 318 and 320 can be implemented in several different forms including a varifocal zoom, multiple afocal tube lenses with focusing optics, or multiple image forming mag tubes.

Sensor

The sensor subsystem in this embodiment includes at least one sensor. This sensor can be a linear sensor or an array sensor. For this application a sensor generally should have high speed, low noise readout, high quantum efficiency, long lifetimes, and high contrast transfer function. High quantum efficiencies are important because they require less light from the illumination system to fully expose the sensor. This also means less energy is required on the sample surface, thus tending to limit the potential for damage from the laser illumination. Long lifetime sensors minimize the possibility that the sensor performance changes with time, decreasing the risk of system recalibration. A high Contrast Transfer Function (CTF) is required to detect the image with adequate resolution. A low CTF tends to limit the inspection system's ability to detect small defects. A CTF generally as low as approximately 0.4 is acceptable for an inspection system, however a value of 0.6 or greater is desirable.

For applications requiring high efficiency, especially at wavelengths less than 400 nm, a back thinned silicon sensor can be used. Many other types of sensors may also be employed, including but not limited to front side devices where front illumination may include virtual phase design, use of open areas to improve UV sensitivity, and may incorporate florescent coatings. The sensor may also incorporate antiblooming capability.

Data Acquisition

The data acquisition subsystem used with the current inspection system operates in a scanning mode with the data readout synchronized to a continuously moving stage. Area sensors must be operated in either TDI mode for Flash mode. TDI mode entails synchronizing the charge in the detector with an image that is moving across the detector. This also allows for high speed data acquisition while maintaining long integration times. As the image moves across the sensor, charge is clocked from one stage to the next. The number of stages determines the amount if of signal integration. A larger number of stages can provide improved light sensitivity. These long integration times can improve speckle smoothing and reduce laser illumination power that can damage the sample.

The data acquisition subsystem can use a single sensor, which may have a large area for sensing in accordance with the description above. The sensor may fill the imaging field of view to maximize the available area.

Multiple sensors may also be employed. These sensors may be located in relatively close proximity. They can be mounted on the same electronics board and even butted together effectively producing a larger sensor. The sensors can also be spatially separated from each other. This can have an advantage because it may be difficult to pack all the readout electronics near the location of the sensor.

The field of the imaging subsystem can be split into multiple parts using a scraping mirror, beam splitter, prism, grating, or diffractive optic. Each part can then be sent to one sensor. Ideally, the splitting is done at a field plane so the impact on the image fidelity is minimized. It is also possible to locate the sensors at different focal positions to gather in and out of focus data simultaneously. It is also possible to have different imaging modes provide data to the different sensors to simultaneously gather defect data. For example, bright field and dark field data could be gathered simultaneously to determine different types of defects.

Data Analysis

The embodiment illustrated in FIG. 3 uses data analysis subsystem is to identify yield limiting defects on a sample. Defects are primarily identified using comparison techniques. One comparison technique used primarily for wafer inspection uses the comparison of different dies. For example, if dies 1 and 2 are compared and a difference is found at location A and dies 2 and 3 are compared and a difference is also found at location A, the defect at location is attributed to die 2.

Another technique uses a comparison between different cells within a die. A cell is defined such that it repeats many times within the inspection area of interest. This type of comparison is useful for memory areas within a die. It is often desired to have an adjustable magnification in the imaging subsystem to each cell can be adjusted to an integral number of sensor pixels.

A third comparison technique is die-to-database comparison. In order to compare data from the inspection system to the database, the database must be rendered by taking into account the performance of the imaging and sensor subsystems and their effect on the database. This rendered database can then be compared to the data gathered by the inspection system.

The defect data can then be sent to other systems for further analysis such as e-beam review, macro review, or focused ion beam destructive analysis. The data can also be sent to yield management software for use in fab wide yield improvement.

Thus the present design is a system for inspecting a specimen comprising an illumination subsystem configured to produce multiple channels of light energy, each channel of light energy produced having differing characteristics (type, wavelength, etc.) from at least one other channel of light energy. The system also includes optics configured to receive the multiple channels of light energy and combine them into a spatially separated combined light energy beam, and the optics direct the spatially separated combined light energy beam toward the specimen. The system also includes a data acquisition subsystem having at least one detector configured to detect reflected light energy received from the specimen. The data acquisition subsystem is configured to separate reflected light energy into multiple received channels corresponding to the multiple channels of light energy. As shown in FIG. 3, two such light energy channels may be employed and two received channels generated. The result is the ability to perform multiple mode, spatially split field inspection of the specimen.

Figure 4:
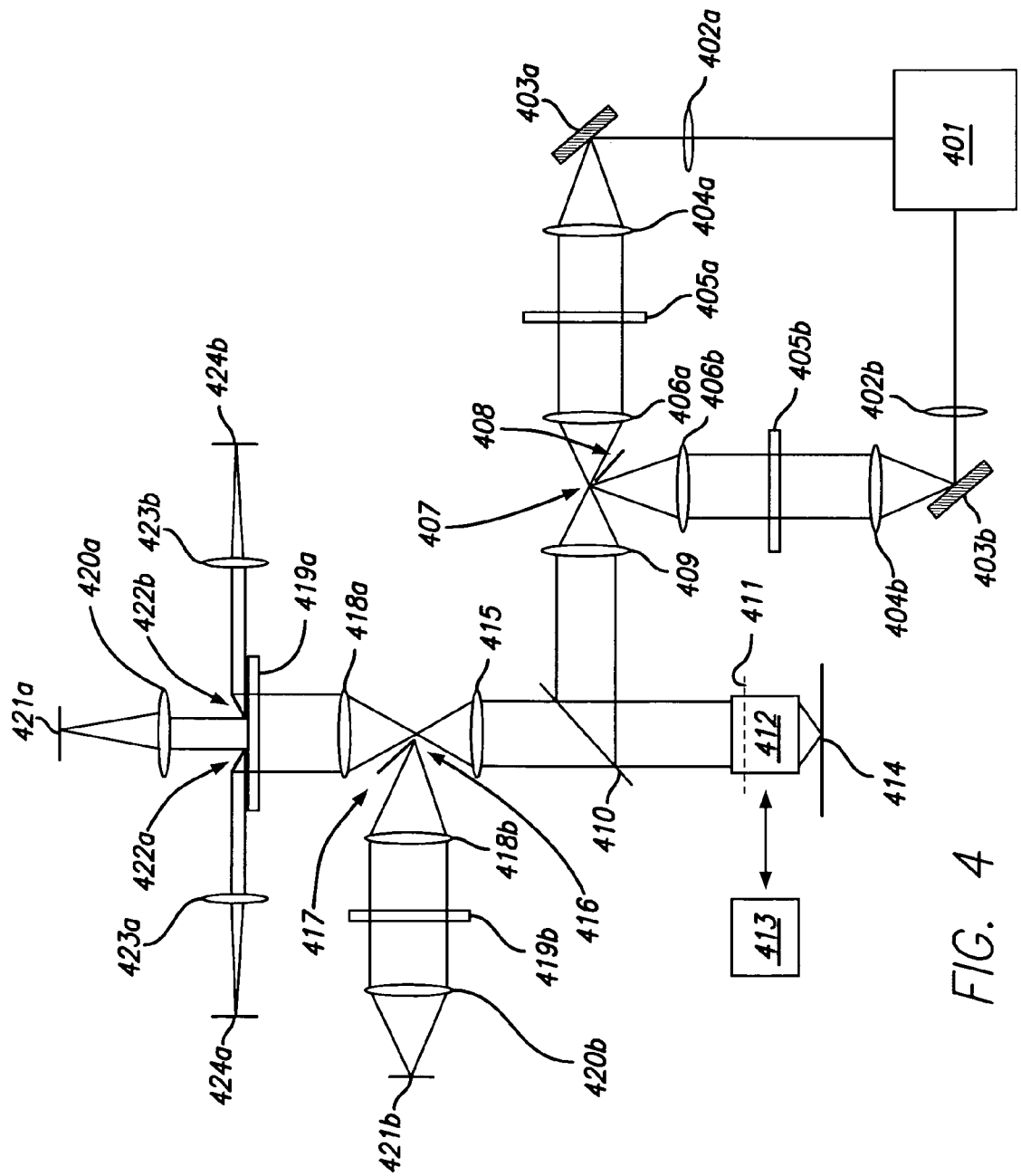
FIG. 4 is an inspection system including the same basic subsystems as in FIG. 3 that employs ultra-high NA small catadioptric objectives and supports simultaneous bright field and double dark field inspection modes.

The second embodiment is an inspection system that includes the same basic subsystems as the first embodiment with ultra-high NA small catadioptric objectives to support simultaneous bright field and double dark field inspection modes. This embodiment is shown in FIG. 4. The drawing in FIG. 4 shows a schematic layout with single lens elements. A system may require additional lens elements in the illumination and imaging subsystems in order to achieve a desired level of performance.

From FIG. 4, illumination from laser source 401 is sent to one or more sections of the illumination subsystem. A first section of the illumination subsystem is comprised of elements 402a through 406a. Lens 402a focuses light from laser 401. Light from lens 402a then reflects from mirror or reflective surface 403a. Mirror 403a is placed at this location for the purposes of illustration. Light from mirror 403a is then collected by lens 404a which forms illumination pupil plane 405a. An aperture, filter, or other device to modify the light may be placed in pupil plane 405a depending on the requirements of the inspection mode. Light from pupil plane 405a then passes through lens 406a and forms illumination field plane 407. Likewise, a second section of the illumination subsystem is comprised of elements 402b through 406b. Lens 402b focuses light from laser 401. Light from lens 402b then reflects from mirror 403a. Light from mirror 403b is then collected by lens 404b which forms illumination pupil plane 405b.

An aperture, filter, or other device to modify the light may be placed in pupil plane 405b depending on the requirements of the inspection mode. Light from pupil plane 405b then passes through lens 406b and forms illumination field plane 407. The second section is then redirected by mirror 408. Illumination field light at 407 is thus comprised of the combined illumination sections. Field plane light is then collected by lens 409 before reflecting of beamsplitter 410. Lenses 406a and 409 form an image of first illumination pupil plane 405a at objective pupil plane 411. Likewise, lenses 406b and 409 form an image of second illumination pupil plane 405b at objective pupil plane 411.

Objective 412 or 413 then take pupil light 411 and form an image of illumination field 407 at the sample 414. Objectives 412 and 413 can be positioned in proximity to sample 414. Sample 414 can move on a stage, which positions the sample in the desired location. Light reflected and scattered from the sample 414 will be collected by the high NA catadioptric objective 412 or 413. After forming a reflected light pupil at 411 light passes beamsplitter 410 and lens 415 before forming an internal field 416 in the imaging subsystem. This internal imaging field is an image of sample 414 and correspondingly illumination field 407. This field may be spatially separated into two fields, corresponding to the bright field and double dark field illumination modes.

In this embodiment the portion of the field corresponding to the bright field inspection mode is redirected using mirror 417. The redirected light then passes through lens 418b before forming another imaging pupil 419b. This imaging pupil is an image of the pupil 411 and correspondingly illumination pupil 405b. An aperture, filter, or other device to modify the light may be placed in pupil plane 419b depending on the requirements of the inspection mode. Light from pupil plane 419b then passes through lens 420b and forms an image on sensor 421b. The portion of the internal field 416 corresponding to the double dark field inspection mode passes mirror 417 is collected by lens 418a and forms imaging pupil 419a.

This pupil light can be spatially separated into a normal channel and two scattered light channels. Light for the normal channel passes through a central hole in an aperture placed at the imaging pupil 419a. Normal channel light is then collected by lens 420a before forming an image on detector 421a. Scattered light from the sample 414 passes though holes in an aperture placed at pupil plane 419a and is redirected using mirrors 422a and 422b. Scattered light is then imaged on detectors 424a and 424b using lenses 423a and 423b.

Illumination

Illumination in the embodiment of FIG. 4 has the same options as described in the embodiment of FIG. 3. The primary difference is that field plane 407 contains one portion corresponding to bright field illumination and one portion corresponding to directional dark field illumination. Both types of illumination must be matched to the respective sensors. For bright field illumination, an area illumination at field 407 is used corresponding to the TDI sensor area. Light corresponding to this illumination can be contained in illumination path including optics 402a through 406a. For directional darkfield, line or area illumination can be used at field 407. Line illumination can be used for a linear sensor and area illumination can be used for TDI sensors. Light corresponding to directional darkfield illumination can be contained in illumination path including optics 402b through 406b. Mirror 408 is used to redirect the illumination light so its optical axis is coaligned or nearly coaligned with illumination light from the brightfield path.

Imaging

Imaging in the embodiment of FIG. 4 has generally the same options as described in FIG. 3. The primary difference is that pupil plane 419a contains an aperture corresponding to double dark field imaging collection. The normal collection channel corresponds to the center of the mask placed at 419a. The high angle scattering directional darkfield portions corresponds to the apertures at the sides of the mask placed at 419a. Light from the normal collection channel passes through imaging lens 420a and is imaged on linear sensor 421a. Light from the directional darkfield scattering is directed into two separate channels by mirrors 422a and 422b. Light from mirror 422a is collected by lens 423a and imaged on linear sensor 424a. Similarly, light redirected by mirror 422b is collected by lens 423b and imaged on linear sensor 424b.

Autofocus

The current embodiment has a major advantage for maintaining the focus position of the sample using standard autofocusing techniques. The sensitivity of the autofocus is often dependent on the numerical aperture of the collection optics. Systems that use smaller numerical apertures for the autofocus system will have reduced autofocus sensitivity. This typically causes the image to move dramatically when using directional darkfield inspection modes that collect high angle scattered light. The design of FIG. 4 supports such high angle imaging and inspection in channels using sensors 424a and 424b.

Sensor

The sensor subsystem in this embodiment includes one TDI sensor for the brightfield channel and three additional sensors for the directional darkfield channels. These sensors may be linear sensors or TDI sensors. Many prior systems only support linear sensors for directional darkfield inspection at high collection angles. This can cause sample damage because of the high fluence in the tightly focused line. The present design supports TDI sensors in the directional darkfield channels because such sensors produce a two dimensional image of the sample. This can dramatically reduce the fluence on the sample and allow for increased inspection speed.

The sensors typically exhibit characteristics including high speed, low noise readout, high quantum efficiency, long lifetimes, and high contrast transfer function such as shown in the embodiment of FIG. 3.

Data Acquisition/Data Analysis

The data acquisition subsystem used in this embodiment operates in a similar manner to that in the embodiment shown in FIG. 3. The TDI sensor and linear sensors are typically independently synchronized to the scanning stage. The current embodiment uses a data analysis subsystem with the same comparison techniques as described above.

A third embodiment of the present design is an inspection system using ultra-high NA small catadioptric objectives to support simultaneous inspection and defect classification. This embodiment uses components similar to those presented in FIGS. 3 and 4. The primary difference is that both fields are not used for inspection—one of the fields is used for high speed inspection and the other field is used for high speed defect classification. The inspection and classification modes can be any of the modes discussed above with respect to FIG. 3. For many defect types, bright field or a type of dark field are best suited for the high speed inspection mode. For many of these defect types, bright field is best suited for high speed defect classification.

High speed defect classification is difficult because of the large amount of information that must be processed. A method to simplify high speed classification is to use a separate image field for classification. The classification channel should image the same portion of the sample imaged by the inspection channel. The classification channel does not have to image the same portion of the sample at the same time as the inspection channel, but can image the same portion either before or after the inspection channel. Data acquired in this separate classification channel are stored in a temporary buffer. Defects are identified using the inspection channel by using one of the data analysis techniques described above with respect to FIG. 3. For example, cell-to-cell subtraction is ideal for identifying defects in memory array areas.

When a defect is identified using the comparison techniques in the inspection channel, the corresponding image area is identified in the classification channel and image data is moved from the temporary buffer to longer term memory for further processing and defect classification. The temporary buffer is typically large enough to contain image data for the all of the patterns used in the comparison as well as the time required to transfer data out of the buffer. The oldest image data in the temporary buffer is continuously overwritten by new image data unless a defect is identified is detected. After the data from the defect area is moved from the temporary buffer to longer term memory it can then be overwritten.

The present design is therefore a system for inspecting a specimen comprising an illumination subsystem comprising a laser, an imaging subsystem comprising at least one small sized catadioptric objective configured to receive light energy from the illumination subsystem, at least one objective configured to support multiple simultaneous inspection modes, and a data acquisition subsystem comprising at least one detector configured to detect light energy received from said specimen. The simultaneous modes may use the same laser wavelength, and/or the laser may produce more than one wavelength. The laser may include any of the 157, 193, 198, 213, 244, 257, 266, 308, 351, 355, 364, 405, or 532 nm wavelengths. The imaging and illumination subsystems may support at least one of a group of inspection modes comprising bright field, ring dark field, directional dark field, aperture shaping, full sky, aerial imaging, confocal, and fluorescence. Each laser wavelength may have a corresponding objective, and any one objective or more than one objective may support an NA in the range of 0.9 to 0.97. The objective may have a field size in the range of 0.8 mm to 3.5 mm. Different inspection modes may occupy different locations within the objective field of view. The inspection modes may be redirected at a field plane or a pupil plane in the imaging subsystem. Separation may be accomplished using a mirror or partial mirror.

Light from at least one redirected inspection mode may interact with at least one optical element that is unique to that inspection mode. Separation may be accomplished using a mirror or partial mirror. Light from at least one redirected inspection mode interacts with at least one optical element that is unique to that inspection mode. The sensor may comprise a back thinned sensor, may be operated in a TDI sensing mode, and/or may have anti-blooming capability. At least two of the redirected inspection modes may use different portions of the same sensor. Each redirected inspection mode is detected using a separate sensor.

The illumination subsystem may contain a relay with internal field and pupil planes and the imaging subsystem may include a single fixed objective. The imaging subsystem may include more than one fixed objective. Multiple objectives on a turret or stage may be provided to move the objectives into proximity of the sample to be inspected. Alternately, at least one fixed objective and multiple objectives may be provided on a turret or stage for moving them into proximity of the sample to be inspected. The imaging subsystem may include a beamsplitter for accepting light from the illumination subsystem or the autofocus subsystem. Alternately, the imaging subsystem may include multiple beamsplitters for accepting light from illumination subsystem, each of which is optimized for a different wavelength range. The beamsplitters can translate into light from the illumination subsystem depending on the desired wavelength.

The beamsplitter may be located at an internal field, and may include a highly reflective ring to support the ring dark field inspection mode. At least one afocal tube lens can be used. A zoom system may be used to change the nominal magnification by at least 2% to support cell-to-cell inspection. A varifocal system may be used to form an image on the sensor. A fixed magnification tube lens may be used to form an image on the sensor. An internal pupil plane may be available in the imaging subsystem for aperturing and Fourier filtering.

The data acquisition subsystem may employ a plurality of sensors within the imaging objective field of view. A die-to-die, die to database, or cell-to-cell comparison may be used to identify a defect on the sample. Each sensor may be located proximate within a field of view of the imaging subsystem. Each sensor may be physically spaced from any other sensor and an imaging subsystem field comprising a plurality of portions and each portion of the field may be sent to a different sensor.

The sample may be a partially fabricated integrated circuit. The data and sample may be sent to a high resolution system for defect analysis. The high resolution system may be an e-beam inspection system or focused ion beam system. The high resolution system and the excimer system may be components of one inspection tool. Data can be stored in an open format accessible by a plurality of process tools.

One of the multiple modes is used for real time defect classification. Data from the classification mode may be stored in temporary memory. Information in the temporary memory is stored in long term memory only if a defect is detected using one of the other imaging modes. At least one imaging mode may be bright field, or modes can include bright field and directional dark field. Directional darkfield modes may use TDI sensors.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A system for inspecting a specimen comprising:
    an illumination subsystem configured to produce a plurality of channels of laser light energy, each channel of light energy produced having differing characteristics from at least one other channel of light energy, wherein said differing characteristics comprise at least one from a group comprising differing illumination modes and differing frequencies;
    optics configured to receive the plurality of channels of light energy and combine the plurality of channels of light energy into one combined light energy beam and direct the one combined light energy beam toward the specimen at a substantially normal angle of incidence; and a data acquisition subsystem comprising at least one detector configured to detect reflected light energy directed toward said at least one detector at a substantially normal reflected angle of incidence from said specimen;

wherein the data acquisition subsystem is configured to separate reflected light energy into a plurality of received channels corresponding to the plurality of channels of light energy using an optical element unique to one differing characteristic of one channel of light energy.

2. The method of claim 1, wherein at least one channel of light energy comprises dark field light energy.

3. The method of claim 1, wherein at least one channel of light energy comprises light energy of a similar type but a different frequency than another channel of light energy.

4. The method of claim 1, wherein the one combined light energy beam comprises light energy combined from two spatially separated light energy beams differing in frequency.

5. The method of claim 1, wherein the optics comprise a plurality of reflective surfaces and a plurality of lenses causing multiple channels of laser light energy to converge at a single location for transmission toward the specimen.

6. The method of claim 5, wherein the optics further comprise at least one aperture inserted within one channel of light energy path.

7. The method of claim 1, wherein the specimen is inspected using a first channel of light energy while defects on the specimen are classified using a second channel of light energy.

8. A method of inspecting a specimen comprising:
producing a plurality of channels of light energy, each channel of light energy produced having differing characteristics from at least one other channel of light energy wherein said differing characteristics comprise at least one from a group comprising differing illumination modes and differing frequencies;

combining the plurality of channels of light energy into one combined light energy beam;

directing the one combined light energy beam toward the specimen at a substantially normal angle of incidence; and detecting reflected light energy directed toward at least one detector at a substantially normal reflected angle of incidence from said specimen, said detecting comprising separating reflected light energy into a plurality of received channels corresponding to the plurality of channels of light energy using an optical element unique to one differing characteristic of one channel of light energy.

9. The method of claim 8, wherein at least one channel of light energy comprises dark field light energy.

10. The method of claim 8, wherein at least one channel of light energy comprises light energy of a similar type but a different frequency than another channel of light energy.

11. The method of claim 8, wherein the one combined light energy beam comprises light energy combined from two spatially separated light energy beams differing in frequency.

12. The method of claim 8, wherein the combining employs optics comprising a plurality of reflective surfaces and a plurality of lenses causing multiple channels of light energy to converge at a single location for transmission toward the specimen.

13. The method of claim 12, wherein the optics further comprise at least one aperture inserted within one channel of light energy path.

14. The method of claim 8, wherein the specimen is inspected using a first channel of light energy while defects on the specimen are classified using a second channel of light energy.

15. A system for inspecting a specimen comprising:
an illumination subsystem configured to produce a plurality of channels of light energy having differing characteristics, wherein said differing characteristics comprise at least one from a group comprising differing illumination modes and differing frequencies;

optics configured to combine the plurality of channels of energy into one combined light energy beam and direct the one combined light energy beam toward the specimen at a substantially normal angle of incidence; and a data acquisition subsystem configured to separate reflected light energy from the specimen into a plurality of received channels corresponding to the plurality of channels of light energy using an optical element unique to one differing characteristic of one channel of light energy and detect the reflected light energy directed toward at least one detector at a substantially normal angle of incidence from said specimen.

16. The system of claim 15, wherein at least one channel of light energy comprises dark field light energy.

17. The system of claim 15, wherein at least one channel of light energy comprises light energy of a similar type but a different frequency than another channel of light energy.

18. The system of claim 15, wherein the one combined light energy beam comprises light energy combined from two spatially separated light energy beams differing in frequency.

19. The system of claim 15, wherein the optics comprise a plurality of reflective surfaces and a plurality of lenses causing multiple channels of light energy to converge at a single location for transmission toward the specimen.

20. The system of claim 19, wherein the optics further comprise at least one aperture inserted within one channel path.

21. The system of claim 15, wherein the specimen is inspected using a first channel of light energy while defects on the specimen are classified using a second channel of light energy.

* * * * *